US011479668B2

(12) United States Patent
Yamazaki et al.

(10) Patent No.: US 11,479,668 B2
(45) Date of Patent: Oct. 25, 2022

(54) CURABLE GRANULAR SILICONE COMPOSITION, CURED OBJECT OBTAINED THEREFROM, AND PRODUCTION METHOD THEREFOR

(71) Applicant: DOW TORAY CO., LTD., Tokyo (JP)

(72) Inventors: Ryosuke Yamazaki, Ichihara (JP); Toru Imaizumi, Ichihara (JP); Kouichi Ozaki, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 390 days.

(21) Appl. No.: 16/756,940

(22) PCT Filed: Oct. 15, 2018

(86) PCT No.: PCT/JP2018/038258
§ 371 (c)(1),
(2) Date: Apr. 17, 2020

(87) PCT Pub. No.: WO2019/078140
PCT Pub. Date: Apr. 25, 2019

(65) Prior Publication Data
US 2021/0189129 A1    Jun. 24, 2021

(30) Foreign Application Priority Data

Oct. 20, 2017  (JP) .............................. JP2017-203186

(51) Int. Cl.
| C08L 83/04 | (2006.01) |
| B29C 45/00 | (2006.01) |
| H01L 33/56 | (2010.01) |
| H01L 33/60 | (2010.01) |
| H01L 51/00 | (2006.01) |
| B29K 83/00 | (2006.01) |
| B29K 105/00 | (2006.01) |

(52) U.S. Cl.
CPC .......... *C08L 83/04* (2013.01); *B29C 45/0001* (2013.01); *H01L 33/56* (2013.01); *H01L 33/60* (2013.01); *H01L 51/0094* (2013.01); *B29K 2083/00* (2013.01); *B29K 2105/0005* (2013.01); *C08L 2205/025* (2013.01); *C08L 2205/03* (2013.01)

(58) Field of Classification Search
None
See application file for complete search history.

(56) References Cited

U.S. PATENT DOCUMENTS

| 5,064,924 A | 11/1991 | Shimizu et al. | |
| 2009/0099321 A1* | 4/2009 | Yoshitake | C08L 83/04 525/475 |
| 2009/0171013 A1 | 7/2009 | Taguchi et al. | |
| 2009/0259011 A1* | 10/2009 | Berry | C08J 3/14 528/25 |
| 2009/0298980 A1* | 12/2009 | Yoshitake | C08L 83/04 524/154 |
| 2015/0183960 A1 | 7/2015 | Yamazaki et al. | |
| 2015/0315427 A1* | 11/2015 | Yoshida | C08K 3/36 524/506 |
| 2017/0166701 A1 | 6/2017 | Jo et al. | |
| 2017/0355804 A1 | 12/2017 | Fujisawa et al. | |
| 2018/0105692 A1 | 4/2018 | Imaizumi et al. | |
| 2018/0208816 A1 | 7/2018 | Yamazaki et al. | |
| 2019/0169398 A1 | 6/2019 | Yamazaki et al. | |
| 2019/0169435 A1 | 6/2019 | Yamazaki et al. | |
| 2019/0177488 A1 | 6/2019 | Yamazaki et al. | |
| 2022/0048230 A1* | 2/2022 | Imaizumi | C08K 5/14 |
| 2022/0049100 A1* | 2/2022 | Yamazaki | C08G 77/12 |
| 2022/0064447 A1* | 3/2022 | Yamazaki | H01L 21/56 |
| 2022/0064491 A1* | 3/2022 | Yamazaki | C09J 7/35 |

FOREIGN PATENT DOCUMENTS

| JP | 2009155415 A | 2/2011 |
| JP | 2014009322 A | 1/2014 |
| JP | 2016124967 A | 7/2016 |
| JP | 2017512224 A | 5/2017 |
| WO | 2015194158 A1 | 12/2015 |
| WO | 2016103654 A1 | 6/2016 |
| WO | 2016136243 A1 | 9/2016 |
| WO | 2018030286 A1 | 2/2018 |
| WO | 2018030287 A1 | 2/2018 |
| WO | 2018030288 A1 | 2/2018 |

OTHER PUBLICATIONS

English translation of International Search Report for PCT/JP2018/038258 dated Jan. 8, 2019, 2 pages.
Machine assisted English translation of JP2016124967A obtained from https://patents.google.com/patent on Apr. 16, 2020, 21 pages.

* cited by examiner

*Primary Examiner* — Robert S Loewe

(74) *Attorney, Agent, or Firm* — Warner Norcross + Judd LLP

(57) ABSTRACT

Provided is a curable granular silicone composition which has hot-melt properties, is excellent in terms of handleability and curability in overmolding and the like, and gives cured objects and the like highly inhibited from taking a color at high temperatures. The curable granular silicone composition comprises: (A) organopolysiloxane resin fine particles which do not have hot-melt properties and have a curing-reactive functional group containing a carbon-carbon double bond and in which siloxane units represented by $RSiO_{3/2}$ (where R is a monovalent organic group) or $SiO_{4/2}$ account for at least 20 mol % of all the siloxane units; (B) a liquid, linear or branched organopolysiloxane having, in the molecule, at least two curing-reactive functional groups containing a carbon-carbon double bond; (C) a hardener; and (D) a functional filler. The composition as a whole has hot-melt properties. Uses of the curable granular silicone composition are also disclosed.

15 Claims, No Drawings

CURABLE GRANULAR SILICONE COMPOSITION, CURED OBJECT OBTAINED THEREFROM, AND PRODUCTION METHOD THEREFOR

CROSS-REFERENCE TO RELATED APPLICATIONS

This application is the National Stage of International Appl. No. PCT/JP2018/038258 filed on 15 Oct. 2018, which claims priority to and all advantages of Japanese Appl. No. 2017-203186 filed on 20 Oct. 2017, the content of which is hereby incorporated by reference.

TECHNICAL FIELD

The present invention relates to a curable granular silicone composition which can be obtained by a simple production method and has excellent hot-melt properties/moldability and creates cured objects and the like having excellent coloring resistance at high temperatures, and a molded product (such as a pellet, a sheet) and a cured object thereof. Further, the present invention relates to a cured object of the composition and uses thereof (particularly, including a semiconductor member such as a reflective material and an optical semiconductor having the cured object), a method for producing the composition, and a method for molding a cured object, and the like.

BACKGROUND ART

Curable silicone compositions are utilized in a wide range of industrial fields because they are cured to form cured objects having excellent heat resistance, cold resistance, electrical insulation, weather resistance, water repellency, and transparency. The cured object of such a curable silicone composition is also suitable as a sealant for optical materials and semiconductor devices because it is hardly discolored as compared to other organic materials and physical properties are less deteriorated.

The present applicant has proposed, in Patent Document 1 and Patent Document 2, a hot-melt curable granular silicone composition and a reactive silicone composition for molding. These silicone compositions are composed of a so-called phenyl silicone resin, and have the advantages of having excellent hot-melt properties and excellent hardness and strength of the cured object as compared with a methyl silicone resin.

On the other hand, in recent years, miniaturization and high output of optical semiconductor devices and the like have been advancing. So, when these hot-melt curable granular silicone compositions are applied, in particular, coloring derived from the phenyl silicone resin may occur at a high temperature of 200° C. or higher, and particularly, the light reflectance may decrease in the field of reflective materials. Therefore, there is a strong demand for a silicone composition that satisfies the requirements of higher heat resistance and coloring resistance while realizing hot-melt properties and mechanical strength of a cured object after molding.

Here, Patent Document 3 discloses a hot-melt curable silicone sheet using a methyl silicone resin, but does not describe or suggest a granular composition in the present invention. Furthermore, there is no description or suggestion of a composition or a granular composition in which an organic solvent is essential in the kneading step of the composition and which contains a large amount of functional fillers (particularly, white pigments) suitable for a molding material. Furthermore, it is necessary to remove the organic solvent from the composition in the step of preparing a sheet, and only a thin film sheet can be prepared in order to avoid the residual solvent; hence, it is difficult to use it as a composition for molding. Also, heat is applied in the step of removing the solvent; therefore, it is difficult to achieve fast curability/rapid curability required in the molding step. Hence, the composition disclosed in Patent Document 3 has been difficult to apply to the solution of the above problems.

Patent Document 4 discloses a curable silicone pellet for molding using a methyl silicone resin. However, since the preparation of the present composition requires melt kneading at high temperatures, it is difficult to control the curability of the composition, and it is difficult to mold at a low temperature for a short time.

PRIOR ART DOCUMENTS

Patent Documents

[Patent Document 1] WO 2016/136243 Pamphlet
[Patent Document 2] JP2014009322A
[Patent Document 3] JP2017512224A
[Patent Document 4] JP2009155415A

SUMMARY OF THE INVENTION

Problem to be Solved by the Invention

An object of the present invention is to provide a curable granular silicone composition which has hot-melt properties, excellent handleability and curability in overmolding and the like, and which can be produced only by a simple mixing process without requiring heating or working processes used for solvent removal or melt kneading in the production process, and which creates cured objects having excellent coloring resistance and the like at high temperatures. Another object of the present invention is to provide a method to efficiently produce such a curable granular silicone composition. Furthermore, another object of the present invention is to provide a semiconductor device member composed of such a curable granular silicone composition and a cured object such as pellets, a semiconductor device having the cured object, and a molding method of the cured object.

Means for Solving the Problems

As a result of intensive studies, the present inventors found that the above problems can be solved by the curable granular silicone composition comprising:

(A) organopolysiloxane resin fine particles which do not have hot-melt properties as whole molecule and has at least one curing-reactive functional group containing a carbon-carbon double bond in the molecule, and in which siloxane units represented by $RSiO_{3/2}$ (R is a monovalent organic group) or $SiO_{4/2}$ account for at least 20 mol % of all the siloxane units, (B) a liquid, linear or branched organopolysiloxane at 25° C. having, in the molecule, at least two curing-reactive functional groups containing a carbon-carbon double bond, (C) One or more hardener selected from the following (c1) or (c2)
(c1) an organic peroxide, or
(c2) an organohydrogenpolysiloxane having at least two silicon bonded hydrogen atoms in the molecule and a hydrosilylation reaction catalyst, and
(D) a functional filler, wherein the mass ratio of the component (A) and the component (B) is in the range of 90:10 to 50:50; the amount of the component (D) is in the range of 10 to 1000 parts by mass with regards to 100 parts by mass the sum of the components (A) to (C); and the composition as a whole has hot-melt properties. Thus, the present invention has been accomplished based on these findings. Preferably, the curable granular silicone composition of the present invention further comprises (A') non-hot-melt organopolysiloxane resin fine particles represented by a predetermined average unit formula, and having no curing-reactive functional group containing a carbon-carbon double bond in the molecule. Similarly, the curable granular silicone composition of the present invention comprises (E) hot-melt particles having a dropping point of 50° C. or more and a melt viscosity of 10 Pas or less measured by a rotational viscometer at 150° C. The granular composition may be preferably formed into a pellet or a sheet.

Furthermore, the present inventors found that the above problems can be solved by using a cured object of the curable granular silicone composition, in particular, using the cured object as a semiconductor device member (including a light reflecting material), and an optical semiconductor device comprising the cured object. Thus, the present invention has been accomplished based on these findings.

Similarly, the present inventors found that the above problems can be solved by a production method comprising the granulation of each component constituting the curable granular silicone composition by mixing under a temperature condition not exceeding 50° C., and a molding method of cured object using curable granular silicone composition. Thus, the present invention has been accomplished based on these findings.

The above molding method includes transfer molding, compression molding, or injection molding, and the curable granular silicone composition of the present invention is suitably used as a material for these molding techniques. Further, the curable granular silicone composition of the present invention can be suitably used as the molding material for a so-called overmolding method that covers a semiconductor element or a semiconductor circuit board with a cured object by overmolding.

Effects of the Invention

The curable granular silicone composition of the present invention (including in the form of pellets) has hot-melt properties, excellent handleability and curability in overmolding and the like, and which can be produced only by a simple mixing process, and which creates cured objects having excellent coloring resistance and the like at high temperatures. The cured object of the present invention is useful as a member of a semiconductor device, particularly as a reflecting material, and a semiconductor device having the cured object can be obtained. In addition, by using the molding method of the present invention, in particular, overmolding, these cured objects can be efficiently produced in accordance with the applications.

MODE FOR CARRYING OUT THE INVENTION

Curable Granular Silicone Composition

The curable granular silicone composition of the present invention is characterized by containing the following components (A) to (D), and the mass ratio of the component (A) and the component (B) is in the range of 90:10 to 50:50, the amount of the component (D) is in the range of 10 to 1000 parts by mass with regards to 100 parts by mass the sum of the components (A) to (C), and the composition as a whole has hot-melt properties.
(A) organopolysiloxane resin fine particles which do not have hot-melt properties as whole molecule and has at least one curing-reactive functional group containing a carbon-carbon double bond in the molecule, and in which siloxane units represented by $RSiO_{3/2}$ (R is a monovalent organic group) or $SiO_{4/2}$ account for at least 20 mol % of all the siloxane units,
(B) a liquid, linear or branched organopolysiloxane at 25° C. having, in the molecule, at least two curing-reactive functional groups containing a carbon-carbon double bond,
(C) one or more hardener selected from the following (c1) or (c2)
(c1) an organic peroxide, or
(c2) an organohydrogenpolysiloxane having at least two silicon bonded hydrogen atoms in the molecule and a hydrosilylation reaction catalyst, and
(D) functional filler.

The curable granular silicone composition of the present invention may further preferably optionally comprise (E) hot-melt particles having a dropping point of 50° C. or more and a melt viscosity of 10 Pas or less measured by a rotational viscometer at 150° C., or other additives and the like. Further, the curable granular silicone composition of the present invention may be preferably in a form in which the granular composition is formed into a pellet or a sheet, depending on its use. Hereinafter, each of the components and optional components of the composition will be described. Note that, in the present invention, unless otherwise specified, the "average particle diameter" means a primary average particle diameter of the particles.

Component (A)

The component (A) is one of the main components of the present composition. It is an organopolysiloxane resin fine particle containing a curing-reactive functional group that does not have hot-melt properties by itself, but when used in combination with the component (B) within a predetermined quantitative range, it achieves hot-melt properties of the composition as a whole and coloring resistance of a cured object. Such a component (A) needs to be in the form of fine particles alone or together with other components (for example, component (C) a hardener), and is particularly preferably true-spherical silicone fine particles having an average primary particle diameter of 1 to 20 μm.

The component (A) requires a curing reactive group having a carbon-carbon double bond in the molecule. Such a curing reactive group is a hydrosilylation reactive or organic peroxide curable functional group, and forms a cured object by a crosslinking reaction with another component. Such a curing reactive group is an alkenyl group or an acryl group. Examples thereof include an alkenyl group having 2 to 10 carbon atoms such as a vinyl group, allyl group, butenyl group, pentenyl group, hexenyl group, and a heptenyl group; an acryl-containing monovalent organic group such as 3-methacryloxypropyl group and 3-acryloxy-propyl group and the like; particularly preferably a vinyl group or a hexenyl group. On the other hand, the organopolysiloxane resin having no curing reactive group does not itself form a cured object; however, it can be blended as the component (A') described later and is preferable from the viewpoint of improving the hot-melt properties of the composition as a whole and the reinforcing effect.

The component (A) is a solid organopolysiloxane resin fine particle in a solvent-free state and has no hot-melt properties as a whole molecule. Here, having no hot-melt properties means that the resin particles as the component (A) do not exhibit a heat-melting behavior by themselves, and specifically mean that they do not have a softening point and a melt viscosity. In the component (A), such physical properties are not particularly structurally limited, but the functional group in the organopolysiloxane resin is a monovalent hydrocarbon group having 1 to 10 carbon atoms, particularly selected from an alkenyl group and an alkyl group having 1 to 10 carbon atoms such as a methyl group; and preferably, it is substantially free of an aryl group such as a phenyl group. If it contains large amount of phenyl group or the like, the component may have hot-melt properties, and the cured object may have reduced coloring resistance under heat aging (at high temperatures) described below. The functional group bonded to the silicon atom in the component (A) is preferably selected from an alkenyl group such as a methyl group and a vinyl group. Preferably, the methyl groups account for 70 mol % to 99 mol %, more preferably 80 mol % to 99 mol %, and 88 mol % to 99 mol %, of all the functional groups bonded to silicon atoms. The remaining (other?) functional groups bonded to the silicon atom is particularly preferably an alkenyl group such as a vinyl group. Within such a range, the component (A) is a non-hot-melt component, and can be designed as a component whose cured object is particularly excellent in coloring resistance at high temperatures.

The component (A) is solid organopolysiloxane resin fine particles in a solvent-free state, wherein the siloxane units, branched in the molecule, represented by $RSiO_{3/2}$ (R is a monovalent organic group) or $SiO_{4/2}$ account for at least 20 mol % of all the siloxane units. Preferably, these branched siloxane units account for at least 40 mol % or more, more preferably 50 mol %, particularly preferably in the range of 50 to 90 mol % of all the siloxane units. R is a monovalent organic group, preferably a monovalent hydrocarbon group having 1 to 10 carbon atoms, particularly a functional group selected from an alkenyl group and an alkyl group having 1 to 10 carbon atoms such as a methyl group. R is preferably substantially free of an aryl group such as a phenyl group from the viewpoint of technical effects.

The component (A) is preferably (A1) non-hot-melt organopolysiloxane resin particles represented by the following average unit formula:

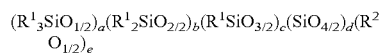

(wherein, each $R^1$ is independently a monovalent hydrocarbon group having 1 to 10 carbon atoms, provided that 1 to 12 mol % of all $R^1$ in one molecule is an alkenyl group; $R^2$ is a hydrogen atom or an alkyl group having 1 to 10 carbon atoms; and a, b, c, d and e are numbers that satisfy: $0.1 \leq a \leq 0.60$, $0 \leq b \leq 0.7$, $0 \leq c \leq 0.8$, $0 \leq d \leq 0.65$, $0 \leq e \leq 0.05$, where $c+d > 0.2$, and $a+b+c+d=1$).

In the above average unit formula, each $R^1$ is independently a monovalent hydrocarbon group having 1 to 10 carbon atoms. Examples thereof include methyl, ethyl, propyl, butyl, pentyl, hexyl, heptyl, or similar alkyl groups; vinyl, allyl, butenyl, pentenyl, hexenyl, or similar alkenyl groups; phenyl, tolyl, xylyl, or similar aryl groups; benzyl, phenethyl or similar aralkyl groups; chloromethyl, 3-chloropropyl, 3,3,3-trifluoropropyl, or similar halogenated alkyl groups; and the like. Furthermore, the alkenyl group accounts for 1 to 12 mol %, preferably 2 to 10 mol %, of all $R^1$ in one molecule. If the content of the alkenyl group is less than the lower limit of the above range, the mechanical strength (hardness or the like) of the obtained cured object may be insufficient. On the other hand, if the content of the alkenyl group is less than the upper limit of the above range, the composition containing this component can achieve satisfactory hot-melt performance as a whole composition. Note that, each $R^1$ is preferably a functional group selected from an alkyl group having 1 to 10 carbon atoms such as a methyl group and an alkenyl group such as a vinyl group and a hexenyl group. And, from the viewpoint of the technical effects of the invention, $R^1$ is preferably substantially free of an aryl group such as a phenyl group. If a large amount of an aryl group such as a phenyl group is contained, the coloring resistance of the cured object at high temperatures may be deteriorated.

In the formula, $R^2$ is a hydrogen atom or an alkyl group having 1 to 10 carbon atoms. Examples of the alkyl group of $R^2$ include methyl, ethyl, propyl, butyl, pentyl or hexyl.

In the formula, 'a' is a number indicating the ratio of siloxane units of the general formula: $R^1_3SiO_{1/2}$. This number satisfies $0.1 \leq a \leq 0.60$, preferably $0.15 \leq a \leq 0.55$. If 'a' is equal to or more than the lower limit of the above range, the composition containing this component can achieve satisfactory hot-melt performance as the whole composition. On the other hand, if 'a' is equal to or less than the upper limit of the above range, the mechanical strength (hardness or the like) of the obtained cured object does not become too low.

In the formula, 'b' is a number indicating the ratio of siloxane units of the general formula: $R^1_2SiO_{2/2}$. This number satisfies $0 \leq b \leq 0.7$, preferably $0 \leq b \leq 0.6$. If 'b' is equal to or less than the upper limit of the above range, the composition containing this component can achieve satisfactory hot-melt performance as a whole composition, and can obtain a granular composition with low stickiness at room temperature.

The value of c+d indicating the sum of the branched siloxane units is preferably in the range of $0.2 < c+d \leq 0.90$, more preferably in the range of $0.30 \leq c+d \leq 0.90$, and in the range of $0.40 \leq c+d \leq 0.90$. Within this numerical range, the composition containing this component can have satisfactory hot-melt performance as the whole composition; the mechanical strength of the obtained cured object is excellent, the composition having good handleability with no stickiness as a whole granular composition can be obtained.

In the formula, 'c' is a number indicating the ratio of siloxane units of the general formula: $R^1SiO_{3/2}$. This number satisfies $0 \leq c \leq 0.8$, preferably $0 \leq c \leq 0.75$. If 'c' is equal to or less than the upper limit of the above range, the composition containing this component can achieve satisfactory hot-melt performance as the whole composition, and can obtain a hot-tack-free hot-melt material at room temperature. In the formula, 'd' is a number indicating the ratio of siloxane units of the general formula: $SiO_{4/2}$. This number satisfies $0.20 \leq d \leq 0.65$, preferably $0.25 \leq d \leq 0.60$. If 'd' is equal to or more than the lower limit of the above range, a granular composition having low stickiness at room temperature can be obtained. On the other hand, if 'd' is equal to or less than the upper limit of the above range, a material that achieves satisfactory hot-melt performance as the whole composition can be obtained.

In the formula, 'e' is a number indicating the ratio of a unit of the general formula: $R^2O_{1/2}$. The unit here means a hydroxyl group or an alkoxy group bonded to a silicon atom contained in the organopolysiloxane resin. This number satisfies $0 \leq e \leq 0.05$, preferably $0 \leq e \leq 0.03$. If 'e' is equal to or less than the upper limit of the above range, a material that achieves satisfactory hot-melt performance as the whole composition can be obtained. Note that, the sum total of a, b, c, and d, which is the sum of each siloxane unit, is finally equal to 1.

The component (A) is an organopolysiloxane resin that is solid at room temperature and has no hot-melt properties by itself. However, by mixing a predetermined amount thereof with the component (B) described later, the composition as a whole exhibits hot-melt properties. Specifically, when the mass ratio of the component (A) and the component (B) is in the range of 90:10 to 50:50, preferably in the range of 85:15 to 55:45, the composition as a whole exhibits hot-melt properties. Here, if the amount of the component (A) is equal to or more than the above lower limit, the resulting granular composition will have less stickiness at room temperature and excellent handleability. If the amount of the component (A) is equal to or less than the above upper limit, the composition as a whole can exhibit satisfactory hot-melt properties.

The component (A) is a particulate organopolysiloxane resin having the above characteristics, preferably, true-spherical organopolysiloxane resin fine particles having an average primary particle diameter of 1 to 20 µm that is measured by a laser diffraction/scattering method or the like. By using such a particulate component, the present composition can be prepared or produced as a curable granular composition having excellent handleability and hot-melt properties. Here, the method for producing the component (A) is not limited, and a known method can be used.

Examples of the method for producing the particulate component (A) include a method of pulverizing the organopolysiloxane resin using a pulverizer, or a method of directly atomizing the organopolysiloxane resin in the presence of a solvent. The pulverizer may be, for example, but not limited to, a roll mill, a ball mill, a jet mill, a turbo mill, or a planetary mill. Examples of the method of directly atomizing the organopolysiloxane resin in the presence of a solvent include spraying by a spray dryer, or atomization by a biaxial kneader or a belt dryer. Note that, when obtaining the particulate component (A), the component (C) described later, for example, a hydrosilylation reaction catalyst or the like, may be preferably atomized together with the component (A).

Particularly, by using a spray dryer or the like, component (A) having a true spherical shape and an average primary particle diameter of 1 to 500 µm, preferably 1 to 20 µm can be produced. The heating and drying temperature of the spray dryer needs to be appropriately set based on the heat resistance of the organopolysiloxane resin fine particles and the like. In order to prevent the secondary aggregation of the obtained fine particles, it is preferable to control the temperature of the organopolysiloxane resin fine particles to be equal to or lower than the glass transition temperature thereof. The organopolysiloxane resin fine particles thus obtained can be recovered by a cyclone, a bag filter, or the like.

A solvent may be used in the above atomization within the range that does not inhibit the curing reaction. Examples of the solvents include, but are not limited to, aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyltrisiloxane, and decamethyltetrasiloxane; esters such as ethyl acetate, butyl acetate, and propylene glycol monomethyl ether acetate; and ketones such as acetone, methyl ethyl ketone, and methyl isobutyl ketone.

Component (A')

In addition to the component (A) of the present invention, it is preferable to further include organopolysiloxane resin fine particles which do not have hot-melt properties alone and do not contain a curing-reactive functional group. Such a component, unlike the component (A), does not contain a curing-reactive functional group, and is specifically represented by the following average unit formula:

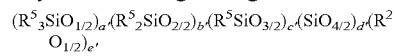

In the formula, each $R^5$ is independently a monovalent hydrocarbon group having 1 to 10 carbon atoms having no aliphatic unsaturated carbon bond. Examples thereof include methyl, ethyl, propyl, butyl, pentyl, hexyl, heptyl, or similar alkyl groups; phenyl, tolyl, xylyl, or similar aryl groups; benzyl, phenethyl, or similar aralkyl groups; chloromethyl, 3-chloropropyl, 3,3,3-trifluoropropyl, or similar halogenated alkyl groups, and the like. Each $R^5$ is preferably an alkyl group having 1 to 10 carbon atoms such as a methyl group, and from the viewpoint of the technical effects of the invention, $R^5$ is preferably substantially free of an aryl group such as a phenyl group. If a large amount of an aryl group such as a phenyl group is contained, the coloring resistance of the cured object at high temperatures may be deteriorated. $R^2$ is the same as the group exemplified as the hydrogen atom or the alkyl group having 1 to 10 carbon atoms in the component (A).

a', b', c', d' and e' are numbers that satisfy: $0.35 \leq a' \leq 0.55$, $0 \leq b' \leq 0.2$, $0 \leq c' \leq 0.2$, $0.45 \leq d' \leq 0.65$, $0 \leq e' \leq 0.05$, and $a'+b'+c'+d'=1$. That is, the component (A') is organopolysiloxane resin fine particles composed of siloxane units of $R^5_3SiO_{1/2}$ (=M units) and siloxane units of $SiO_{4/2}$ (=Q units) as main constituent elements; substantially, MQ type organopolysiloxane resin fine particles composed of these constituent units are preferred. By using such organopolysiloxane resin fine particles in combination with the component (A) and the component (B), a granular composition which causes no problems in handleability such as stickiness can be obtained, and the composition as a whole can achieve satisfactory hot-melt properties. Further, although the component (A') does not directly participate in curing, it has the advantage that the strength of the obtained cured object can be improved since the component exerts a reinforcing effect.

The blending amount of the component (A') is optional. It may be in the range of 0 to 300 parts by mass with respect to 100 parts by mass of the component (A), and it is particularly preferable to blend in the range of 75 to 250 parts by mass with respect to 100 parts by mass of the component (A). Particularly preferably, it may be in the range of 20 to 45% by mass with respect to the sum of the components (A), (A') and (B).

Component (B)

The component (B) is one of the main components of the present composition. It is a liquid, linear or branched organopolysiloxane at 25° C. having, in the molecule, at least two curing-reactive functional groups containing a carbon-carbon double bond. Such a curing-reactive chain organopolysiloxane is mixed with the above solid organopolysiloxane resin particles at a mass ratio described above, so the composition as a whole exhibits hot-melt properties.

Similarly to the component (A), the component (B) needs to have a curing reactive group having a carbon-carbon double bond in the molecule. Such a curing reactive group is a hydrosilylation reactive or organic peroxide curable functional group, and forms a cured object by a crosslinking reaction with another component. Such a curing reactive group is an alkenyl group or an acryl group. Examples thereof include the same groups as described above, and a vinyl group or a hexenyl group is particularly preferable.

The component (B) is a liquid, linear or branched organopolysiloxane at 25° C. (room temperature). The component (B) is mixed with the solid component (A) at room temperature at a mass ratio described above, so the composition as a whole exhibits hot-melt properties. The structure thereof may have a branched organopolysiloxane having a few branched siloxane units (for example, General formula: T unit represented by $R^3SiO_{3/2}$ ($R^3$ is independently a monovalent hydrocarbon group having 1 to 10 carbon atoms) or Q unit represented by $SiO_{4/2}$), preferably (B1) a linear diorganopolysiloxane represented by the following structural formula:

$R^3_3SiO(SiR^3_2O)_kSiR^3_3$ (wherein, each $R^3$ is independently a monovalent hydrocarbon group having 1 to 10 carbon atoms, provided that at least two of $R^3$ in one molecule are alkenyl groups, and k is a number between 20 and 5,000).

Preferably, a linear diorganopolysiloxane having one alkenyl group at both ends of the molecular chain is preferred.

In the formula, each $R^3$ is independently a monovalent hydrocarbon group having 1 to 10 carbon atoms. Examples thereof include methyl, ethyl, propyl, butyl, pentyl, hexyl, heptyl, or similar alkyl groups; vinyl, allyl, butenyl, pentenyl, hexenyl, or similar alkenyl groups; phenyl, tolyl, xylyl, or similar aryl groups; benzyl, phenethyl or similar aralkyl groups; chloromethyl, 3-chloropropyl, 3,3,3-trifluoropropyl, or similar halogenated alkyl groups; and the like. Furthermore, at least two of $R^3$ in one molecule are alkenyl groups, preferably vinyl groups. Each $R^3$ is preferably a functional group selected from an alkyl group having 1 to 10 carbon atoms such as a methyl group and an alkenyl group such as a vinyl group and a hexenyl group. At least two of all $R^3$ are preferably alkenyl groups and the remaining $R^3$ is preferably a methyl group. From the viewpoint of the technical effects of the invention, $R^3$ is preferably substantially free of an aryl group such as a phenyl group. If a large amount of an aryl group such as a phenyl group is contained, the coloring resistance of the cured object at high temperatures may be deteriorated. $R^3$ having an alkenyl group such as a vinyl group at both ends of the molecular chain is particularly preferred and the other $R^3$ is preferably a methyl group.

In the formula, 'k' is a number from 20 to 5,000, preferably from 30 to 3,000, particularly preferably from 45 to 800. If 'k' is equal to or more than the lower limit of the above range, a granular composition having low stickiness at room temperature can be obtained. On the other hand, if 'k' is equal to or less than the upper limit of the above range, the composition as a whole having satisfactory hot-melt performance can be achieved.

The combination of the above components (A) and (B) is not limited, but, a combination of the component (A) having a relatively low molecular weight and the component (B) having a relatively high molecular weight; or the combination of the component (A) having a relatively high molecular weight and the component (B) having a relatively low molecular weight is preferable from the viewpoint of particle formation. On the other hand, if the component (A) and the component (B) having relatively low molecular weights are combined, two may be compatible with each other and cannot be formed into particles. Note that, in the combination of the high-molecular-weight MQ resin and the high-molecular-weight (long-chain) vinylpolysiloxane disclosed in Patent Document 3, both cannot be mixed without using a solvent, and cannot be formed into a granular composition. This results in poor moldability and handleability.

Here, in order for the composition as a whole to have hot-melt properties, it is necessary that the mass ratio of the component (A) and the component (B) is in the range of 90:10 to 50:50, preferably in the range of 85:15 to 55:45. If the amount of the component (B) is equal to or more than the lower limit of the above range, satisfactory hot-melt properties can be obtained, and the mechanical strength of the obtained cured object can be increased. On the other hand, if the amount of the component (B) is equal to or less than the upper limit of the above range, stickiness of the obtained granular composition at room temperature can be reduced, and the handleability is improved.

The component (C) is a hardener for curing the components (A) and (B), and specifically, is one or more hardeners selected from the following (c1) or (c2). Note that, two or more of these hardeners may be used in combination. For example, a hardening system containing both the component (c1) and the component (c2) may be used.

(c1) an organic peroxide, or
(c2) an organohydrogenpolysiloxane having at least two silicon bonded hydrogen atoms in the molecule and a hydrosilylation reaction catalyst.

(C1) organic peroxide is a component that cures the components (A) and (B) by heating. Examples of organic peroxide include alkyl peroxides, diacyl peroxides, ester peroxides, and carbonate peroxides.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethyl-butylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

The organic peroxide preferably has a 10-hour half-life temperature of 90° C. or more, or 95° C. or more. Examples of such organic peroxide include dicumyl peroxide, di-t-butyl peroxide, di-t-hexyl peroxide, t-butylcumyl peroxide, 2,5-dimethyl-2,5-di(tert-butylperoxy)hexane, 1,3-bis(tert-butylperoxyisopropyl)benzene, di-(2-t-butylperoxyisopropyl)benzene, and 3,6,9-triethyl-3,6,9-trimethyl-1,4,7-triperoxonan.

While not limited thereto, the content of (c1) organic peroxide is preferably within the range of 0.05 to 10 parts by mass, or within the range of 0.10 to 5.0 parts by mass, with respect to the sum (100 parts by mass) of the components (A) and (B).

(c2) An organohydrogenpolysiloxane having at least two silicon bonded hydrogen atoms in the molecule and a hydrosilylation reaction catalyst are the components that cure the composition by subjecting the organohydrogenpolysiloxane as a crosslinking agent to an addition reaction (hydrosilylation reaction) with a carbon-carbon double bond in the components (A) and (B) in the presence of a hydrosilylation reaction catalyst.

From the viewpoint of moldability and curability of the curable granular silicone composition, the organohydrogenpolysiloxane is preferably an organohydrogenpolysiloxane resin containing a monoorganosiloxy unit represented by $RSiO_{3/2}$ (T unit, R is a monovalent organic group or a silicon bonded hydrogen atom) or a branched siloxy unit represented by $SiO_{4/2}$ (Q unit), and having at least two hydrogendiorganosiloxy units represented by $HR_2SiO_{1/2}$ ($M^H$ unit, R is independently a monovalent organic group) in the molecule and having $M^H$ unit at the molecular terminal. From the viewpoint of the above technical effects, the component (C) is substantially free of the linear organohydrogenpolysiloxane containing a large number of $D^H$ units.

The organohydrogenpolysiloxane is particularly preferably an organohydrogenpolysiloxane resin represented by the following average unit formula:

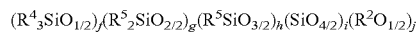

$$(R^4{}_3SiO_{1/2})_f(R^5{}_2SiO_{2/2})_g(R^5SiO_{3/2})_h(SiO_{4/2})_i(R^2O_{1/2})_j$$

In the formula, each $R^4$ is the same or different and is a hydrogen atom or a monovalent hydrocarbon group having 1 to 10 carbon atoms, having no aliphatic unsaturated carbon bond, provided that at least two $R^4$ in one molecule are hydrogen atoms. Examples of the monovalent hydrocarbon group represented by $R^4$ other than a hydrogen atom include methyl, ethyl, propyl, butyl, pentyl, hexyl, heptyl, or similar alkyl groups; phenyl, tolyl, xylyl, or similar aryl groups; benzyl, phenethyl or similar aralkyl groups; chloromethyl, 3-chloropropyl, 3,3,3-trifluoropropyl, or similar halogenated alkyl groups; and the like. A methyl group or a phenyl group is preferred from an industrial point of view.

In the formula, $R^5$ is a monovalent hydrocarbon group having 1 to 10 carbon atoms, having no aliphatic unsaturated bond. Examples thereof include the same groups as the above monovalent hydrocarbon groups. On the other hand, $R^2$ is a hydrogen atom or an alkyl group having 1 to 10 carbon atoms. Examples thereof include the same groups as $R^2$ in the component (A).

In the formula, f, g, h and i are numbers that satisfy: $0.1 \le f \le 0.80$, $0 \le g \le 0.5$, $0 \le h \le 0.8$, $0 \le i \le 0.6$, $0 \le j \le 0.05$, where $h+i>0.1$, and $f+g+h+i+j=1$. Here, the specific examples of the organohydrogenpolysiloxane resin that is a part of the component (c2) include an organohydrogenpolysiloxane resin having no $D^H$ unit, such as $M^H MT$ resin, $M^H MTT^H$ resin, $M^H MTQ$ resin, $M^H MQ$ resin, $M^H MTT^H Q$ resin.

The content of the organohydrogenpolysiloxane, which is a part of the component (c2), is an amount sufficient to cure the curable granular silicone composition of the present invention. The amount is such that the molar ratio of silicon bonded hydrogen atoms in the organohydrogenpolysiloxane is 0.5 or more, preferably in the range of 0.5 to 20, with respect to the curing-reactive functional group (for example, an alkenyl group such as a vinyl group) containing a carbon-carbon double bond in the components (A) and (B). In particular, when the component (c2) contains the above organohydrogenpolysiloxane resin, the molar ratio of silicon bonded hydrogen atoms in the organohydrogenpolysiloxane resin is in the range of 5 to 20, or preferably in the range of 1.0 to 10, with respect to the curing-reactive functional group containing a carbon-carbon double bond in the components (A) and (B).

Examples of the hydrosilylation reaction catalyst, which is a part of the component (c2), include platinum-based catalysts, rhodium-based catalyst, and palladium-based catalysts, and platinum-based catalysts are preferable because the curing of the present composition can be remarkably accelerated. Examples of the platinum-based catalyst include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, and a platinum-alkenyl siloxane complex particularly preferable. Examples of this alkenyl siloxane include 1,3-divinyl-1,1,3,3-tetramethyldisiloxane; 1,3,5,7-tetramethyl-1,3,5,7-tetravinylcyclotetrasiloxane; an alkenyl siloxane obtained by substituting part of methyl groups of these alkenyl siloxanes with an ethyl group, a phenyl group, and the like; and an alkenyl siloxane obtained by substituting part of vinyl groups of these alkenyl siloxanes with an allyl group, a hexenyl group, and the like. In particular, 1,3-divinyl-1,1,3,3-tetramethyldisiloxane is preferable because the platinum-alkenyl siloxane complex has good stability and it is preferable to add in the form of an alkenylsiloxane solution complex. In addition, a particulate platinum-containing hydrosilylation reaction catalyst dispersed or encapsulated with a thermoplastic resin may be used from the viewpoint of improving handling workability and pot life of the composition. As the catalyst for promoting the hydrosilylation reaction, a non-platinum metal catalyst such as iron, ruthenium, iron/cobalt, or the like may be used.

The amount of the hydrosilylation reaction catalyst to be added, which is a part of the component (c2), is preferably an amount in which the metal atom is within the range of 0.01 to 500 ppm, an amount within the range of 0.01 to 100 ppm, or an amount within the range of 0.01 to 50 ppm in terms of mass units with respect to the composition as a whole.

The component (c2) particularly preferably contains at least (c2-1) an organohydrogenpolysiloxane resin represented by the above average unit formula and a hydrosilylation reaction catalyst.

The curable granular silicone composition of the present invention preferably further contains (D) a functional filler, in addition to the above components (A) to (C), from the viewpoint of having a desired function in the cured object when cured under high temperature after heat melting (hot-melt), and giving the cured object excellent in hardness and toughness at room temperature to high temperature. In particular, the curable granular silicone composition of the present invention is excellent in hot-melt properties/moldability and the coloring resistance of its cured object at high temperatures; therefore, coloring of the cured object containing a white pigment at a high temperature can be suppressed, and the high light reflectance of the cured object can be maintained.

The component (D) functional filler is a component that imparts mechanical properties and other properties of the cured object. Examples thereof include inorganic fillers, organic fillers, and mixtures thereof. Examples of the inorganic filler include a reinforcing filler, a white pigment, a thermally conductive filler, an electrically conductive filler, a phosphor, and a mixture of at least two of these. Examples of the organic filler include a silicone resin filler, a fluorine resin filler, and a polybutadiene resin filler. The shape of these fillers is not particularly limited, and may be spherical, spindle-shaped, flat, needle-shaped, amorphous, or the like.

From the viewpoint of using the coloring resistance of the cured object at high temperatures, which is a characteristic based on the selection of the components (A) to (C), and using the cured object obtained by curing the present composition as a light reflecting material for a light emitting/optical device, the component (D) is preferably a functional filler containing at least a white pigment. Furthermore, when the present composition is used in an application such as a sealant, a protective agent, or an adhesive, the component (D) preferably further contains a reinforcing filler from the viewpoint of improving the mechanical strength of the cured object and improving the protective property and the adhesive property.

White pigment is a component that imparts whiteness to the cured object and improves light reflectivity. The present component is blended to cure the present composition, thereby forming a cured object. The obtained cured object can be used as a light reflecting material for a light emitting/optical device. Examples of the white pigment include metal oxides such as titanium oxide, aluminum oxide, zinc oxide, zirconium oxide, and magnesium oxide; hollow fillers such as glass balloons and glass beads; and barium sulfate, zinc sulfate, barium titanate, aluminum nitride, boron nitride, and antimony oxide. Titanium oxide is preferred because of its high light reflectivity and opacifying property. In addition, aluminum oxide, zinc oxide, and barium titanate are preferable because of their high light reflectivity in the UV region. The average particle diameter and shape of the white pigment are not limited, but the average particle diameter is preferably in the range of 0.05 to 10.0 μm, or in the range of 0.1 to 5.0 μm. The white pigment may be surface treated with a silane coupling agent, silica, aluminum oxide, or the like.

The reinforcing filler may be added as a binder filler for the purpose of maintaining the solid particulate state of the curable granular silicone composition before curing, in addition to improving the mechanical strength of the cured object and improving the protective property and the adhesive property. Examples of the reinforcing filler include fumed silica, precipitated silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may also be surface treated with organoalkoxysilanes such as methyltrimethoxysilane; organohalosilanes such as trimethylchlorosilane; organosilazanes such as hexamethyldisilazane; siloxane oligomers such as α,ω-silanol group-blocked dimethylsiloxane oligomers, α,ω-silanol group-blocked methylphenylsiloxane oligomers, α,ω-silanol group-blocked methylvinylsiloxane oligomers, and the like. The particle size of the reinforcing filler is not limited, but the median size measured by a laser diffraction/scattering particle size distribution measurement method is preferably in the range of 1 nm to 500 μm. Further, as the reinforcing filler, a fibrous filler such as calcium metasilicate, potassium titanate, magnesium sulfate, sepiolite, zonolite, aluminum borate, rock wool, glass fiber, or the like may be used.

Furthermore, a thermally conductive filler, an electrically conductive filler or a phosphor may be blended for the purpose of imparting another function to the cured object obtained by using the present composition. Also, an organic filler such as silicone elastomer fine particles may be blended for the purpose of improving the stress relaxation property of the cured object.

The thermally conductive filler or the electrically conductive filler is added for the purpose of imparting thermal/electrical conductivity to the cured object. Specific example thereof include a metal fine powder such as gold, silver, nickel, copper, aluminum; a fine powder obtained by depositing or plating a metal such as gold, silver, nickel, copper or the like on the surface of a fine powder such as ceramic, glass, quartz, organic resin or the like; a metal compound such as aluminum oxide, magnesium oxide, aluminum nitride, boron nitride, zinc oxide or the like; graphite; and a mixture of two or more of these. When electrical insulation is required for the present composition, a metal oxide-based powder or a metal nitride-based powder is preferable, and in particular, an aluminum oxide powder, a zinc oxide powder, or an aluminum nitride powder is preferable. These may be used in a combination of types, particle diameters, particle shapes, and the like according to the requirements of the thermal conductivity/electrical conductivity.

The phosphor is a component that is blended to convert the emission wavelength from a light source (an optical semiconductor element) when the cured object is used as a wavelength conversion material. Examples of the phosphor include, but are not particularly limited to, yellow, red, green, and blue light phosphors, which include oxide phosphors, oxynitride phosphors, nitride phosphors, sulfide phosphors, oxysulfide phosphors, and the like, which are widely used in light emitting diodes (LED).

Silicone fine particles include non-reactive silicone resin fine particles and silicone elastomer fine particles, but silicone elastomer fine particles are preferably exemplified from the viewpoint of improving flexibility or stress relaxation properties of the cured object.

The silicone elastomer fine particles are crosslinked products of linear diorganopolysiloxane comprised of primarily of diorganosiloxy units (D-units). The silicone elastomer fine particles can be prepared by a crosslinking reaction of diorganopolysiloxane by a hydrosilylation reaction, a condensation reaction of a silanol group, or the like, and in particular, the silicone elastomer fine particles can be suitably obtained by a crosslinking reaction of organohydrogenpolysiloxane having a silicon bonded hydrogen atom at a side chain or a terminal with diorganopolysiloxane having an unsaturated hydrocarbon group such as an alkenyl group at a side chain or a terminal under a hydrosilylation reaction catalyst. The silicone elastomer fine particles may have various shapes such as spherical, flat, and irregular shapes, but are preferably spherical in terms of dispersibility, and among these, true spherical is more preferable. Commercial products of such (B) silicone elastomer fine particles include, for example, "Torefil-E series" and "EP Powder series" manufactured by Dow Corning Toray Company, Ltd., and "KMP series" manufactured by Shin-Etsu Chemical Co., Ltd.

For the purpose of stably blending the above functional filler into the granular composition, the filler may be subjected to the surface treatment by using a specific surface treatment agent. The surface treatment agent is used in the range of 0.1 to 2.0 mass %, 0.1 to 1.0 mass %, 0.2 to 0.8 mass % based on the total mass of the component (D). Examples of the surface treatment agent include, for example, methylhydrogenpolysiloxane, silicone resin, metal soap, silane coupling agent, fluorine compound such as perfluoroalkylsilane and perfluoroalkylphosphate ester salt and the like.

The content of the component (D) is not limited, but is preferably in the range of 10 to 4000 parts by mass, 10 to 3500 parts by mass, or 10 to 3000 parts by mass with respect to the sum (100 parts by mass) of component (A) and component (B) for obtaining excellent hardness and mechanical strength of the obtained cured object.

The curable granular silicone composition of the present invention contains the above components (A) to (D). However, from the viewpoint of further improving the melting properties, the curable granular silicone composition of the present invention may also preferably contain (E) hot-melt particles having a dropping point of 50° C. or more and a melt viscosity of 10 Pas or less measured by a rotational viscometer at 150° C.

The type of component (E) is not particularly limited as long as it satisfies the above conditions of the dropping point and conditions of the kinematic viscosity at the time of melting at 150° C. One or more types selected from various hot-melt synthetic resins, waxes, fatty acid metal salts, and the like can be used. The component (E) exhibits a low kinematic viscosity at high temperature (150° C.) and forms a molten material having excellent fluidity. Furthermore, by using the components (A) and (B) together, the component (E) in the molten material composed of the present composition rapidly spreads throughout the composition at a high temperature, so the viscosity of the entire composition and the substrate surface to which the molten composition has been applied is reduced as well as the surface friction of the substrate and the molten composition is rapidly reduced, and the effect of significantly increasing the fluidity of the entire composition is exhibited. Therefore, the addition of a very small amount to the total amount of other components can significantly improve the viscosity and fluidity of the molten composition.

The component (E) may be petroleum-based waxes such as paraffin as long as it satisfies the above conditions of the dropping point and the kinematic viscosity at the time of melting. However, from the viewpoint of the technical effects of the present invention, the component (E) is preferably a hot-melt component comprising a fatty acid metal salt, particularly preferably, a metal salt of higher fatty acid such as stearic acid, palmitic acid, oleic acid and isononanoic acid. Here, the type of the fatty acid metal salt is also not particularly limited, and examples thereof preferably include alkali metal salts such as lithium, sodium and potassium; alkaline earth metal salts such as magnesium, calcium and barium; or zinc salts.

As the component (E), (E0) the fatty acid metal salts having a free fatty acid level of 5.0% or less is particularly preferred, more preferably 4.0% or less, and more preferably 0.05 to 3.5%. As such a component (E0), for example, at least one or more metal stearates are exemplified. From the viewpoint of the technical effects of the present invention, the component (E0) is preferably essentially composed of only one or more metal stearates, and most preferably uses a hot-melt component having a melting point of 150° C. or less selected from calcium stearate (melting point 150° C.), zinc stearate (melting point of 120° C.), and magnesium stearate (melting point 130° C.).

The amount of the component (E) used is such that the content of the component (E0) is in the range of 0.01 to 5.0 parts by mass, 0.01 to 3.5 parts by mass, and 0.01 to 3.0 parts by mass when the whole composition is 100 parts by mass. If the amount of the component (E) used exceeds the above upper limit, the cured object obtained from the granular curable silicone composition of the present invention may have insufficient adhesive property and mechanical strength. If the amount of the component (E) used is less than the above lower limit, sufficient fluidity during heating and melting may not be achieved.

The present composition may contain a curing retardant or an adhesion imparting agent as other optional components as long as the object of the present invention is not impaired.

Examples of the curing retardant include alkyne alcohols such as 2-methyl-3-butyne-2-ol, 3,5-dimethyl-1-hexyne-3-ol, 2-phenyl-3-butyne-2-ol, 1-ethynyl-1-cychlohexanol; enyne compounds such as 3-methyl-3-pentene-1-yne, 3,5-dimethyl-3-hexene-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl tris (1,1-dimethyl propynyloxy) silane and vinyl tris (1,1-dimethyl propynyloxy) silane. The content of the curing retardant is not limited, but is preferably within the range of 10 to 10000 ppm in terms of mass units, with regard to the present composition.

As the adhesion imparting agent, an organosilicon compound having at least one alkoxy group bonded to a silicon atom in one molecule is preferable. Examples of this alkoxy group include a methoxy group, ethoxy group, propoxy group, butoxy group, and a methoxyethoxy group, particularly preferably a methoxy group. Moreover, examples of groups other than alkoxy group, bonded to the silicon atom of the organosilicon compound include halogen substituted or unsubstituted monovalent hydrocarbon groups such as an alkyl group, alkenyl group, aryl group, aralkyl group, and a halogenated alkyl group; glycidoxyalkyl groups such as a 3-glycidoxypropyl group and a 4-glycidoxybutyl group; epoxycyclohexylalkyl groups such as a 2-(3,4-epoxycyclohexyl)ethyl group and a 3-(3,4-epoxycyclohexyl)propyl group; epoxyalkyl groups such as a 3,4-epoxybutyl group and a 7,8-epoxyoctyl group; acryl group-containing monovalent organic groups such as a 3-methacryloxypropyl group; and hydrogen atoms. This organosilicon compound preferably has a group that may react with an alkenyl group or a silicon bonded hydrogen atom in the present composition, and specifically, preferably has a silicon bonded hydrogen atom or an alkenyl group. Moreover, because satisfactory adhesion can be imparted to various base materials, this organosilicon compound preferably has at least one epoxy group-containing monovalent organic group per one molecule. Examples of such an organosilicon compound include an organosilane compound, an organosiloxane oligomer, and an alkyl silicate. Examples of the molecular structure of this organosiloxane oligomer or alkyl silicate include a linear structure, a partially branched linear structure, a branched structure, a cyclic structure, and a network structure, particularly preferably a linear structure, a branched structure, and a network structure. Examples of an organosilicon compound include silane compounds such as 3-glycidoxypropyltrimethoxysilane, 2-(3,4-epoxycyclohexyl)ethyltrimethoxysilane, and 3-methacryloxypropyltrimethoxysilane; mixtures of siloxane compounds having at least one silicon atom bonded alkenyl group or silicon bonded hydrogen atom and at least one silicon bonded alkoxy group in one molecule, silane compounds or siloxane compounds having at least one silicon bonded alkoxy group in one molecule and siloxane compounds having at least one silicon atom bonded hydroxy group and at least one silicon atom bonded alkenyl group in one molecule; reaction mixtures of amino group-containing organoalkoxysilane and epoxy group-containing organoalkoxysilane; organic compounds having at least two alkoxysilyl groups in one molecule and containing a bond other than a silicon-oxygen bond between the silyl groups; epoxy group-containing silane represented by the general formula: $R^a{}_n Si(OR^b)_{4-n}$ (in the formula, $R^a$ is a monovalent epoxy group-containing organic group, and $R^b$ is an alkyl group having 1 to 6 carbon atoms or a hydrogen atom. n is a number in the range of 1 to 3)

or partially hydrolyzed condensate thereof; reaction mixtures of a vinyl group-containing siloxane oligomer (including a chain or cyclic structure) and an epoxy group-containing trialkoxysilane; methyl polysilicate; ethyl polysilicate; and epoxy group-containing ethyl polysilicate. The adhesion imparting agent is preferably in the form of a low viscosity liquid, and its viscosity is not limited, but it is preferably within the range of 1 to 500 mPa·s at 25° C. In addition, while not limited thereto, the content of this adhesion imparting agent is preferably within the range of 0.01 to 10 parts by mass with respect to 100 parts by mass of the total of the present composition.

Furthermore, as long as the object of the present invention is not impaired, the present composition may contain, as other optional ingredients, a heat-resistant agent such as iron oxide (red oxide), cerium oxide, cerium dimethylsilanoate, fatty acid cerium salt, cerium hydroxide, and zirconium compounds; and other agents such as dyes, non-white pigments, flame retardants, and the like.

The present composition may be molded into a pellet or a sheet and used. The pellets are obtained by compression molding the present composition, and are excellent in handleability and curability. The "pellet" may also be referred to as a "tablet." The shape of the pellet is not limited, but is usually spherical, elliptical spherical, or cylindrical. The size of the pellet is not limited, and for example, the pellet has an average particle diameter or a circle equivalent diameter of 500 μm or more.

The present composition may be molded into a sheet and used. For example, a sheet made of a curable granular silicone composition having an average thickness of 500 μm or more, preferably several mm, has hot-melt properties and heat-curable properties at a high temperature; and therefore, it is advantageous in terms of excellent handleability and excellent melting properties, particularly when used for compression molding or the like.

The composition is non-fluid solid at 25° C. for handling in the form of pellets or sheets at room temperature. Here, the term "non-fluid" means that it is not deformed or flowed in a no-load condition, and it is preferable that it is not deformed or flowed in a no-load condition at 25° C. when it is molded into a pellet or a tablet. Such non-fluid can be evaluated, for example, by placing a molded product of the composition on a hot plate at 25° C. and substantially not deforming or flowing under no load or constant weight. This is because, when the composition is non-fluid at 25° C., shape retention at this temperature is good and the surface tackiness is low.

The softening point of the present composition is preferably 100° C. or less. Such a softening point means a temperature at which the deformation amount in the height direction is 1 mm or more when the deformation amount of the composition is measured after the load is removed by continuing to press the hot plate with a load of 100 grams for 10 seconds from above.

The viscosity of the present composition tends to rapidly decrease under high temperature and high pressure (i.e., in the molding step), and it is preferable to use the same value measured under high temperature and high pressure as a useful melt viscosity value. Therefore, the melt viscosity of the present composition is preferably measured under high pressure using a Koka type flow tester (manufactured by Shimadzu Corporation) rather than using a rotatory viscometer such as a rheometer. Specifically, the present composition preferably has a melt viscosity at 150° C. of 200 Pa·s or less, more preferably 150 or less. This is because the adhesiveness to the base material after the composition is hot-melted and then cooled to 25° C. is good.

Method of Producing Curable Granular Silicone Composition

The present composition can be produced by powder-mixing components (A) to (D) and other optional components (preferably containing the component (A') and the component (E)) at a temperature lower than 50° C. The powder mixer used in the present production method is not limited, and examples thereof include a uniaxial or biaxial continuous mixer, a two-roll mixer, a Ross mixer, a Hobart mixer, a dental mixer, a planetary mixer, a kneader mixer, a laboratory mixer, a small-sized mill, and a Henschel mixer, and preferably, a laboratory mixer and a Henschel mixer.

Method of Molding Cured Object

The present composition can be cured by a method comprising at least the following steps (I) to (III):
(I) heating and melting the present composition to 100° C. or higher;
(II) injecting the curable silicone composition obtained in step (I) into a mold or distributing the curable silicone composition obtained in step (I) to a mold by clamping; and
(III) curing the curable silicone composition injected in step (II).

In the above steps, a transfer molding machine, a compression molding machine, an injection molding machine, an auxiliary ram molding machine, a slide molding machine, a double ram molding machine, a low pressure sealing molding machine, or the like can be used. In particular, the composition of the present invention can be suitably used for the purpose of obtaining a cured object by transfer molding and compression molding.

Finally, in step (III), the curable silicone composition injected (applied) in step (II) is cured. When (c1) an organic peroxide is used as the component (C), the heating temperature is preferably 150° C. or higher or 170° C. or higher, and when (c2) an organohydrogenpolysiloxane having at least two silicon bonded hydrogen atoms in the molecule and a hydrosilylation reaction catalyst are used, the heating temperature is preferably 100° C. or higher, or 130° C. or higher.

Since it is suitable as a protective member for a semiconductor or a light reflecting material for a light emitting/optical device, the cured object obtained by curing the present composition preferably has a type-D durometer hardness of 40 or more or 50 or more at 25° C. This type-D durometer hardness is determined by the type-D durometer in accordance with the JIS K 6253-1997 "Hardness Testing Methods for Vulcanized Rubber and Thermoplastic Rubber."

Use of Composition

The composition has hot-melt properties and excellent handleability and curability at the time of melting (hot-melt), and excellent coloring resistance of the obtained cured object at high temperatures; therefore, it is useful for a semiconductor member such as a light reflecting material for a light emitting/optical device and an optical semiconductor having the cured object. Furthermore, since the cured object has excellent mechanical properties, it is suitable as a sealing agent for semiconductors; a sealing agent for power semiconductors such as SiC and GaN; an adhesive for electricity and electronics, a potting agent, a protective agent, and a coating agent. Since the composition has hot-melt properties, it is also suitable as a material for transfer molding, compression molding, or injection molding. In particular, it is preferably used as a sealing agent for a semiconductor using an overmolding method at the time of molding.

Use of Cured Object

The use of the cured object of the present invention is not particularly limited, but the composition of the present invention has hot-melt properties, is excellent in moldability and mechanical properties, and the cured object has the characteristic behavior of the average linear expansion coefficient and the storage modulus at room temperature to high temperature as described above. Therefore, the cured object obtained by curing the present composition can be suitably used as a semiconductor device member, and a sealing material for a semiconductor element or an IC chip, an adhesive or a bonding member for a conductor device.

The semiconductor device provided with the member made of the cured object of the present invention is not particularly limited, but it is particularly preferable to be a light-emitting semiconductor device that is a light-emitting/optical device. Since the cured object of the present invention has excellent coloring resistance at high temperatures, it can be more suitably used as a light reflecting material used in optical semiconductor devices where whiteness is required.

EXAMPLES

The curable granular silicone composition of the present invention, and the production method thereof, and a treatment method of an inorganic filler will be described below in detail with reference to Examples and Comparative Examples. Note that in the formulae, Me, Ph, and Vi represent a methyl group, a phenyl group, and a vinyl group, respectively. Further, with respect to the curable silicone compositions of Examples and Comparative Examples, tablet tableting property, melt viscosity, moldability, and spectral reflectance were measured by the following methods. The curable granular silicone composition was heated at 150° C. for 2 hours to prepare a cured object, and the spectral reflectance, hardness and bending strength immediately after curing/after the heat resistance test were measured by the following methods. The results are shown in Table 1.

Tablet Tableting Property

The curable granular silicone composition was molded into cylindrical pellets of 14 mm×22 mm by compression, and the tableting properties of the tablet were confirmed.

Melt Viscosity

The melt viscosity of the curable granular silicone at 150° C. was measured by a Koka type flow tester CFT-500EX (manufactured by Shimadzu Corporation) under a pressure of 100 kgf using a nozzle having a diameter of 0.5 mm. Note that, when there is no softening and the melt viscosity at 150° C. cannot be measured, it was evaluated as "N/A." This means that the composition does not melt even when heated, i.e. the composition has no hot-melt properties.

Moldability

The curable granular silicone composition was integrally molded with a lead frame made of copper using a transfer molding machine to produce a molded product having a length of 35 mm, a width of 25 mm, a height of 1 mm. As molding conditions, the mold temperature was 150° C. and the mold clamping time was 120 seconds. The molded product was taken out from the mold, and then it was cooled to 25° C. After cooling the molded product, the presence or absence of cracks and the presence or absence of molding defects such as peeling from the lead frame were visually confirmed. The molded products having no particular problem were evaluated as "Good." On the other hand, when the material has poor hot-melt properties and does not spread over the entire mold space at the time of molding, it was evaluated as "Not Good (No melting);" when the molded product found to be uncured when taken out from the mold, it was evaluated as "Not Good (uncured when demolding);" and when the material was not spread over the entire mold when the molded product was taken out from the mold, it was evaluated as "Not Good (unfilled mold)." The results are shown in Table 1.

Spectral Reflectance of Cured Object

The curable granular silicone composition was heated at 150° C. for 2 hours to prepare a 100 μm thick cured object. The spectral reflectance of the cured object was measured using a UV-VIS spectrophotometer UV3100PC (manufactured by Shimadzu Corporation), and the spectral reflectance at a wavelength of 450 nm was read. The cured product after measuring the reflectance was left in an air circulation-type oven at 300° C. for 10 minutes. Thereafter, the spectral reflectance was measured again, and the spectral reflectance at a wavelength of 450 nm was read. The results are shown in Table 1.

Hereinafter, an organopolysiloxane crosslinked product or an organopolysiloxane resin containing a hydrosilylation reaction catalyst was prepared by the methods shown in Reference Examples 1 to 4, and the presence or absence of hot-melt properties was evaluated based on the presence or absence of softening point/melt viscosity. The organopolysiloxane resin fine particles were prepared by the methods shown in Reference Examples 5 to 8. Note that, in the Reference Examples, 1,1,3,3-tetramethyl-1,3-divinyldisiloxane used for a platinum complex that is a hydrosilylation reaction catalyst is described as "1,3-divinyltetramethyldisiloxane."

Reference Example 1

In a 1 L flask, 270.5 g of a 55 mass % xylene solution of an organopolysiloxane resin represented by the average unit formula: $(Me_2ViSiO_{1/2})_{0.09}(Me_3SiO_{1/2})_{0.43}(SiO_{4/2})_{0.48}(HO_{1/2})_{0.03}$, which is a white solid at 25° C., and 0.034 g of a 1,3-divinyltetramethyldisiloxane solution of platinum 1,3-divinyltetramethyldisiloxane complex (content of platinum metal=about 4000 ppm) were charged, and stirred uniformly at room temperature (25° C.) to prepare a xylene solution of organopolysiloxane resin (1) containing 10 ppm platinum metal in terms of mass units. The organopolysiloxane resin (1) did not soften/melt even when heated, and did not have hot-melt properties.

Reference Example 2

In a 1 L flask, 270.5 g of a 55 mass % xylene solution of an organopolysiloxane resin represented by the average unit formula: $(Me_2ViSiO_{1/2})_{0.05}(Me_3SiO_{1/2})_{0.39}(SiO_{4/2})_{0.56}(HO_{1/2})_{0.02}$, which is a white solid at 25° C., and 0.034 g of a 1,3-divinyltetramethyldisiloxane solution of platinum 1,3-divinyltetramethyldisiloxane complex (content of platinum metal=about 4000 ppm) were charged, and stirred uniformly at room temperature (25° C.) to prepare a xylene solution of organopolysiloxane resin (2) containing 10 ppm platinum metal in terms of mass units. The organopolysiloxane resin (2) did not soften/melt even when heated, and did not have hot-melt properties.

Reference Example 3

In a 1 L flask, 270.5 g of a 55 mass % xylene solution of an organopolysiloxane resin represented by the average unit formula: $(Me_3SiO_{1/2})_{0.44}(SiO_{4/2})_{0.56}(HO_{1/2})_{0.02}$, which is a white solid at 25° C., and 0.034 g of a 1,3-divinyltetramethyldisiloxane solution of platinum 1,3-divinyltetramethyldisiloxane complex(content of platinum metal=about 4000 ppm) were charged, and stirred uniformly at room temperature (25° C.) to prepare a xylene solution of organopolysiloxane resin (3) containing 10 ppm platinum metal in terms of mass units. The organopolysiloxane resin (3) did not soften/melt even when heated, and did not have hot-melt properties.

Reference Example 4

In a 1 L flask, 270.5 g of a 55 mass % toluene solution of a resinous organopolysiloxane represented by the average unit formula: $(PhSiO_{3/2})_{0.80}(Me_2ViSiO_{1/2})_{0.20}$, which is a white solid at 25° C.; 21.3 g of a diphenylsiloxane in which both ends of the molecular chain were blocked with dimethylhydrogensiloxy groups and which has a viscosity of 5 mPa·s (content of silicon bonded hydrogen atoms=0.6 mass %) represented by the formula: $HMe_2SiO(Ph_2SiO)SiMe_2H$ (at an amount such that the amount of silicon bonded hydrogen atoms in the present component is 0.5 mol with regard to 1 mol of vinyl groups in the resinous organopolysiloxane); and 0.034 g of a 1,3-divinyltetramethyldisiloxane solution of platinum 1,3-divinyltetramethyldisiloxane complex (content of platinum metal=about 4000 ppm) (at an amount such that platinum metal becomes 10 ppm in terms of mass units with regard to the liquid mixture) were charged, and stirred uniformly at room temperature. Thereafter, the temperature in the flask was raised to 100° C. by an oil bath, and the mixture was stirred under a reflux of toluene for 2 hours to prepare a toluene solution of an organosiloxane crosslinked product (1) having a resin linear structure containing a resinous organosiloxane moiety derived from the above-mentioned resinous organopolysiloxane and a chained organosiloxane moiety derived from the above-mentioned diphenylsiloxane and having a vinyl group not involved in the above-mentioned reaction. When the organosiloxane crosslinked product (1) was analyzed by FT-IR, peaks of silicon bonded hydrogen atom were not observed. The organosiloxane crosslinked product (1) had a softening point of 75° C., a melt viscosity of 100 Pa·s at 150° C., and had hot-melt properties.

Reference Example 5: Non-hot-Melt Organopolysiloxane Resin Fine Particles (1)

True-spherical non-hot-melt organopolysiloxane resin fine particles (1) were prepared by atomizing the xylene solution of the organopolysiloxane resin (1) prepared in Reference Example 1 by a spray method using a spray dryer at 50° C. while removing xylene. Observation of the fine particles with an optical microscope revealed that the particle diameter was 5 to 10 μm and the average particle diameter was 6.5 μm.

Reference Example 6: Non-Hot-Melt Organopolysiloxane Resin Fine Particles (2)

True-spherical non-hot-melt organopolysiloxane resin fine particles (2) were prepared by atomizing the xylene solution of the organopolysiloxane resin (2) prepared in Reference Example 2 by a spray method using a spray dryer at 50° C. while removing xylene. Observation of the fine particles with an optical microscope revealed that the particle diameter was 5 to 10 μm and the average particle diameter was 6.9 μm.

Reference Example 7: Non-Hot-Melt Organopolysiloxane Resin Fine Particles (3)

True-spherical non-hot-melt organopolysiloxane resin fine particles (3) were prepared by atomizing the xylene solution of the organopolysiloxane resin (3) prepared in Reference Example 3 by a spray method using a spray dryer at 50° C. while removing xylene. Observation of the fine particles with an optical microscope revealed that the particle diameter was 5 to 10 μm and the average particle diameter was 7.4 μm.

Reference Example 8: Hot-Melt Silicone Fine Particles (1)

True-spherical hot-melt silicone fine particles (1) were prepared by atomizing the toluene solution of the organosiloxane crosslinked product (1) prepared in Reference Example 4 by a spray method using a spray dryer at 40° C. while removing toluene. Observation of the fine particles with an optical microscope revealed that the particle diameter was 5 to 10 μm and the average particle diameter was 7.5 μm.

Hereinafter, the curable compositions of Examples 1 to 3 and Comparative Examples 1 to 4 were prepared, and the properties thereof were evaluated by the above methods. The results are shown in Table 1.

Example 1

42.5 g of (a1+c2 (pt)) non-hot-melt organopolysiloxane resin fine particles (1); 21.2 g of (a2+c2 (pt)) non-hot-melt organopolysiloxane resin fine particles (2); 32.0 g of (b1) dimethyl polysiloxane in which both ends of the molecular chain were blocked with dimethylvinylsiloxy groups (content of vinyl groups=0.09 mass %) represented by the formula:

6.2 g of (c2(SiH)) organohydrogenpolysiloxane resin (content of silicon bonded hydrogen atoms=0.95 mass %) represented by the formula: $(HMe_2SiO_{1/2})_{0.67}(SiO_{4/2})_{0.33}$ {at an amount such that the amount of silicon bonded hydrogen atoms in the organohydrogenpolysiloxane resin is 1.0 mol with regard to 1 mol of vinyl groups in the organopolysiloxane resin fine particles (1) and (2) and dimethyl polysiloxane in which both ends of the molecular chain were blocked with dimethylvinylsiloxy groups};

299.0 g of (d1) titanium oxide (SX-3103 manufactured by Sakai Chemical Industry Co., Ltd.) having an average particle diameter of 0.5 μm;

4.0 g of (d2) fumed silica (AEROSIL 50 manufactured by Nippon Aerosil Co., Ltd.) having an average particle diameter of 0.04 μm;

0.8 g of (e1) calcium stearate (manufactured by Kawamura Kasei Co., Ltd., melt viscosity at 150° C. is 5 Pa·s) having an average particle diameter of 7.5 μm; and 1-ethynyl-1-cyclohexanol (at an amount of 1000 ppm in terms of mass units with regard to the present composition) were introduced into a small-sized mill at once. The mixture was stirred for 1 minute at room temperature (25° C.) to prepare a uniform and white curable granular silicone composition. Next, this composition was tableted by a tableting machine to prepare cylindrical pellets having a diameter of 14 mm and a height of 22 mm. The measurement results of the moldability thereof or the like are shown in Table 1.

Example 2

41.8 g of (a1+c2 (pt)) non-hot-melt organopolysiloxane resin fine particles (1); 20.9 g of (a'+c2 (pt)) non-hot-melt organopolysiloxane resin fine particles (3); 32.0 g of (b1) dimethyl polysiloxane in which both ends of the molecular chain were blocked with dimethylvinylsiloxy groups (content of vinyl group=0.09 mass %) represented by the formula:

$ViMe_2SiO(Me_2SiO)_{800}SiViMe_2$;

4.7 g of (c2(SiH)) organohydrogenpolysiloxane resin (content of silicon bonded hydrogen atoms=0.95 mass %) represented by the formula:

$(HMe_2SiO_{1/2})_{0.67}(SiO_{4/2})_{0.33}$

{at an amount such that the amount of silicon bonded hydrogen atoms in the organohydrogenpolysiloxane resin is 1.0 mol with regard to 1 mol of vinyl groups in the organopolysiloxane resin fine particles (1) and dimethyl polysiloxane in which both ends of the molecular chain were blocked with dimethylvinylsiloxy groups};

295.0 g of (d3) titanium oxide (CR-93, manufactured by Ishihara Sangyo Co., Ltd) having an average particle diameter of 0.28 μm;

4.0 g of (d2) fumed silica (AEROSIL 50 manufactured by Nippon Aerosil Co., Ltd.) having an average particle diameter of 0.04 μm;

0.8 g of (e1) calcium stearate (manufactured by Kawamura Kasei Co., Ltd., melt viscosity at 150° C. is 5 Pa·s) having an average particle diameter of 7.5 μm; and 1-ethynyl-1-cyclohexanol (at an amount of 1000 ppm in terms of mass units with regard to the present composition) were introduced into a small-sized mill at once. The mixture was stirred for 1 minute at room temperature (25° C.) to prepare a uniform and white curable granular silicone composition. Next, this composition was tableted by a tableting machine to prepare cylindrical pellets having a diameter of 14 mm and a height of 22 mm. The measurement results of the moldability thereof or the like are shown in Table 1.

Example 3

28.4 g of (a2+c2 (pt)) non-hot-melt organopolysiloxane resin fine particles (2); 42.6 g of (a'+c2 (pt)) non-hot-melt organopolysiloxane resin fine particles (3); 32.0 g of (b2) dimethyl polysiloxane in which both ends of the molecular chain were blocked with dimethylvinylsiloxy groups (content of vinyl groups=1.53 mass %) represented by the formula:

$ViMe_2SiO(Me_2SiO)_{45}SiViMe_2$;

3.8 g of (c2 (SiH)) organohydrogenpolysiloxane resin (content of silicon bonded hydrogen atoms=0.95 mass %) represented by the formula:

$(HMe_2SiO_{1/2})_{0.67}(SiO_{4/2})_{0.33}$

{at an amount such that the amount of silicon bonded hydrogen atoms in the organohydrogenpolysiloxane resin is 1.0 mol with regard to 1 mol of vinyl groups in the organopolysiloxane resin fine particles (2) and dimethyl polysiloxane in which both ends of the molecular chain were blocked with dimethylvinylsiloxy groups};

299.0 g of (d1) titanium oxide (SX-3103 manufactured by Sakai Chemical Industry Co., Ltd.) having an average particle diameter of 0.5 μm;

4.0 g of (d2) fumed silica (AEROSIL 50 manufactured by Nippon Aerosil Co., Ltd.) having an average particle diameter of 0.04 μm;

0.8 g of (e1) calcium stearate (manufactured by Kawamura Kasei Co., Ltd., melt viscosity at 150° C. is 5 Pa·s) having an average particle diameter of 7.5 μm; and 1-ethynyl-1-cyclohexanol (at an amount of 1000 ppm in terms of mass units with regard to the present composition) were introduced into a small-sized mill at once. The mixture was stirred for 1 minute at room temperature (25° C.) to prepare a uniform and white curable granular silicone composition. Next, this composition was tableted by a tableting machine to prepare cylindrical pellets having a diameter of 14 mm and a height of 22 mm. The measurement results of the moldability thereof or the like are shown in Table 1.

Comparative Example 1

42.5 g of (a1+c2 (pt)) non-hot-melt organopolysiloxane resin fine particles (1); 21.2 g of (a2+c2 (pt)) non-hot-melt organopolysiloxane resin fine particles (2); 6.2 g of (c2 (SiH)) organohydrogenpolysiloxane resin (content of silicon bonded hydrogen atoms=0.95 mass %) represented by the formula:

$(HMe_2SiO_{1/2})_{0.67}(SiO_{4/2})_{0.33}$

{at an amount such that the amount of silicon bonded hydrogen atoms in the organohydrogenpolysiloxane resin is 1.03 mol with regard to 1 mol of vinyl groups in the organopolysiloxane resin fine particles (1) and (2)};

299.0 g of (d1) titanium oxide (SX-3103 manufactured by Sakai Chemical Industry Co., Ltd.) having an average particle diameter of 0.5 μm;

4.0 g of (d2) fumed silica (AEROSIL 50 manufactured by Nippon Aerosil Co., Ltd.) having an average particle diameter of 0.04 μm;

0.8 g of (e1) calcium stearate (manufactured by Kawamura Kasei Co., Ltd., melt viscosity at 150° C. is 5 Pa·s) having an average particle diameter of 7.5 μm; and 1-ethynyl-1- cyclohexanol (at an amount of 1000 ppm in terms of mass units with regard to the present composition) were introduced into a small-sized mill at once. The mixture was stirred for 1 minute at room temperature (25° C.) to prepare a uniform and white curable granular silicone composition. Next, this composition was tableted by a tableting machine to prepare cylindrical pellets having a diameter of 14 mm and a height of 22 mm. The measurement results of the moldability thereof or the like are shown in Table 1.

Comparative Example 2

89.3 g of hot-melt silicone fine particles (1);
10.7 g of (c3 (SiH)) diphenylsiloxane in which both ends of the molecular chain were blocked with dimethylhydrogensiloxy groups (content of silicon bonded hydrogen atoms=0.6 mass %) represented by the formula:

$HMe_2SiO(Ph_2SiO)SiMe_2H$

{at an amount such that the amount of silicon bonded hydrogen atoms in the diphenylsiloxane is 1.0 mol with regard to 1 mol of vinyl groups in the silicone fine particles (1)};
302.2 g of (d3) titanium oxide (CR-93 manufactured by Ishihara Sangyo Co., Ltd.) having an average particle diameter of 0.28 μm;
1.3 g of (d2) fumed silica (AEROSIL 50 manufactured by Nippon Aerosil Co., Ltd.) having an average particle diameter of 0.04 μm;
0.8 g of (e1) calcium stearate (manufactured by Kawamura Kasei Co., Ltd., melt viscosity at 150° C. is 5 Pa·s) having an average particle diameter of 7.5 μm; and 1-ethynyl-1-cyclohexanol (at an amount of 300 ppm in terms of mass units with regard to the present composition) were introduced into a small-sized mill at once. The mixture was stirred for 1 minute at room temperature (25° C.) to prepare a uniform and white curable granular silicone composition. Next, this composition was tableted by a tableting machine to prepare cylindrical pellets having a diameter of 14 mm and a height of 22 mm. The measurement results of the moldability thereof or the like are shown in Table 1.

Comparative Example 3

59.1 g of a 55 mass % xylene solution of an organopolysiloxane resin represented by the formula:

$(ViMe_2SiO_{1/2})_{0.11}(Me_3SiO_{1/2})_{0.33}(SiO_{4/2})_{0.56}(HO_{1/2})_{0.02}$ 59.1 g of a 55 mass % xylene solution of an organopolysiloxane resin represented by the formula;

$(Me_3SiO_{1/2})_{0.44}(SiO_{4/2})_{0.56}(HO_{1/2})_{0.02}$;

28.0 g of (b3) diorganopolysiloxane represented by the formula:

$Me_3SiO(Me_2SiO)_{789}(MeViSiO)_{11}SiMe_3$;

5.0 g of (c3(SiH)) organohydrogenpolysiloxane represented by the formula:

$HMe_2SiO(Me_2SiO)_{17}SiMe_2H$;

2.0 g of (c4(SiH)) organohydrogenpolysiloxane represented by the formula:

$Me_3SiO(MeHSiO)_7(Me_2SiO)_{6.5}SiMe_3$ 0.01 g of (c2 (pt)) 1,1,3,3-tetramethyl-1,3-divinyldisiloxane solution of platinum-1,1,3,3-tetramethyl-1,3-divinyldisiloxane complex (platinum content is 4.5 mass %); and 0.05 g of 1-ethynylcyclohexane-1-ol were stirred using a Hobart mixer for 30 minutes to prepare a uniform curable silicone composition. The mixture was applied on a PET film to a thickness of 100 μm and subsequently heated at 120° C. for 30 minutes to obtain a tack-free film at 25° C. On the other hand, solid cylindrical pellets having a diameter of 14 mm and a height of 22 mm could not be formed at 25° C.; however, the obtained film was rolled into a lump and checked for moldability and the. The results are shown in Table 1.

Comparative Example 4

59.1 g of a 55 mass % xylene solution of an organopolysiloxane resin represented by the formula;

$(ViMe_2SiO_{1/2})_{0.11}(Me_3SiO_{1/2})_{0.33}(SiO_{4/2})_{0.56}(HO_{1/2})_{0.02}$;

59.1 g of a 55 mass % xylene solution of an organopolysiloxane resin represented by the formula:

$(Me_3SiO_{1/2})_{0.44}(SiO_{4/2})_{0.56}(HO_{1/2})_{0.02}$;

28.0 g of (b3) diorganopolysiloxane represented by the formula:

$Me_3SiO(Me_2SiO)_{789}(MeViSiO)_{11}SiMe_3$;

5.0 g of (c3(SiH)) organohydrogenpolysiloxane represented by the formula:

$HMe_2SiO(Me_2SiO)_{17}SiMe_2H$;

2.0 g of (c4(SiH)) organohydrogenpolysiloxane represented by the formula:

$Me_3SiO(MeHSiO)_7(Me_2SiO)_{6.5}SiMe_3$;

0.01 g of (c2(pt)) 1,1,3,3-tetramethyl-1,3-divinyldisiloxane solution of platinum-1,1,3,3-tetramethyl-1,3-divinyldisiloxane complex (platinum metal content: 4.5 mass %);
295.0 g of (d3) titanium oxide (CR-93, manufactured by Ishihara Sangyo Co., Ltd) having an average particle diameter of 0.28 μm;
4.0 g of (d2) fumed silica (AEROSIL 50 manufactured by Nippon Aerosil Co., Ltd.) having an average particle diameter of 0.04 μm;
0.8 g of (e1) calcium stearate (manufactured by Kawamura Kasei Co., Ltd., melt viscosity at 150° C. is 5 Pa·s) having an average particle diameter of 7.5 μm; and
0.05 g of 1-ethynylcyclohexane-1-ol were stirred using a Hobart mixer for 30 minutes to prepare a uniform curable silicone paste. The mixture was applied on a PET film to a thickness of 100 μm and subsequently heated at 120° C. for 30 minutes to obtain a tack-free film at 25° C. On the other hand, solid cylindrical pellets having a diameter of 14 mm and a height of 22 mm could not be formed at 25° C.; however, the obtained film was rolled into a lump and checked for moldability and the. The results are shown in Table 1.

TABLE 1

| | Examples | | | Comparative Examples | | | |
|---|---|---|---|---|---|---|---|
| | 1 | 2 | 3 | 1 | 2 | 3 | 4 |
| Tablet tableting properties | Good | Good | Good | Good | Good | N/A | N/A |
| Melt viscosity [Pa·s] | 180 | 130 | 140 | N/A | 80 | 60 | 320 |

TABLE 1-continued

| | Examples | | | Comparative Examples | | | |
|---|---|---|---|---|---|---|---|
| | 1 | 2 | 3 | 1 | 2 | 3 | 4 |
| Moldability | Good | Good | Good | Not Good (No melting) | Good | Not Good (uncured when de-molding) | Not Good (unfilled mold/ uncured when de-molding) |
| Spectral reflectance [%] Initial stage | 99.4 | 99.3 | 99.2 | * | 99.2 | | * |
| Spectral reflectance [%] After 300° C. ×10 minutes | 95.4 | 95.1 | 95.2 | | 92.4 | | |
| Change in spectral reflectance [%] | 4.0 | 4.2 | 4.0 | | 6.8 | | |

* Due to poor molding, the cured object cannot be obtained by transfer molding for which spectral reflectance and the like can be measured.

The curable granular silicone compositions of Examples 1 to 3 according to the present invention have excellent tableting properties, can obtain pellets, and have hot-melt properties and good transfer moldability. Furthermore, the obtained cured object did not show a significant change in spectral reflectance at the initial stage/after 300° C.×10 minutes, and had excellent coloring resistance.

On the other hand, in Comparative Example 1 containing no component (B) of the present invention, hot-melt properties could not be obtained, and the moldability was poor. In Comparative Examples 3 and 4 containing no component (A) organopolysiloxane resin fine particles, there were no tableting properties, the curing of the composition was insufficient, and good transfer moldability could not be achieved. On the other hand, Comparative Example 2 using hot-melt silicone fine particles had hot-melt properties and good transfer moldability, but the resulting cured object showed a significant change in spectral reflectance at the initial stage/after 300° C. for 10 minutes and had poor coloring resistance.

The invention claimed is:

1. A curable granular silicone composition comprising:
(A) organopolysiloxane resin fine particles which do not have hot-melt properties as whole molecules and have at least one curing-reactive functional group containing a carbon-carbon double bond in the molecule, and in which siloxane units represented by $RSiO_{3/2}$ or $SiO_{4/2}$ account for at least 20 mol % of all the siloxane units, where R is a monovalent organic group;
(B) a liquid, linear or branched organopolysiloxane at 25° C. having, in the molecule, at least two curing-reactive functional groups containing a carbon-carbon double bond;
(C) one or more hardener selected from the following (c1) or (c2):
(c1) an organic peroxide, or
(c2) an organohydrogenpolysiloxane having at least two silicon bonded hydrogen atoms in the molecule and a hydrosilylation reaction catalyst; and
(D) a functional filler;
wherein the mass ratio of component (A) and component (B) is in the range of 90:10 to 50:50; the amount of component (D) is in the range of 10 to 1000 parts by mass with regards to 100 parts by mass the sum of components (A) to (C); and the composition as a whole has hot-melt properties.

2. The curable granular silicone composition according to claim 1, wherein:
component (A) is (A1) a non-hot-melt organopolysiloxane resin particle represented by the following average unit formula:

$$(R^1_3SiO_{1/2})_a(R^1_2SiO_{2/2})_b(R^1SiO_{3/2})_c(SiO_{4/2})_d(R^2O_{1/2})_e$$

wherein, each $R^1$ is independently a monovalent hydrocarbon group having 1 to 10 carbon atoms, provided that 1 to 12 mol % of all $R^1$ in one molecule is an alkenyl group; $R^2$ is a hydrogen atom or an alkyl group having 1 to 10 carbon atoms; and a, b, c, d and e are numbers that satisfy: $0.1 \leq a \leq 0.60$, $0 \leq b \leq 0.7$, $0 \leq c \leq 0.8$, $0 \leq d \leq 0.65$, $0 \leq e \leq 0.05$, where $c+d>0.2$, and $a+b+c+d=1$;

component (B) is (B1) a linear diorganopolysiloxane represented by the following structural formula:

$$R^3_3SiO(SiR^3_2O)_kSiR^3_3$$

wherein, each $R^3$ is independently a monovalent hydrocarbon group having 1 to 10 carbon atoms, provided that at least two of $R^3$ in one molecule are alkenyl groups, and k is a number between 20 and 5,000; and component (D) is at least one component selected from the group consisting of a reinforcing filler, a white pigment, a thermally conductive filler, an electrically conductive filler, an organic filler, and combinations thereof.

3. The curable granular silicone composition according to claim 1, wherein component (A) is true-spherical organopolysiloxane resin fine particles having an average primary particle diameter of from 1 to 20 μm.

4. The curable granular silicone composition according to claim 1, further comprising (A') non-hot-melt organopolysiloxane resin fine particles represented by the following average unit formula:

$$(R^5_3SiO_{1/2})_{a'}(R^5_2SiO_{2/2})_{b'}(R^5SiO_{3/2})_{c'}(SiO_{4/2})_{d'}(R^2O_{1/2})_{e'}$$

wherein, each $R^5$ is independently a monovalent hydrocarbon group having 1 to 10 carbon atoms, having no aliphatic unsaturated carbon bond; $R^2$ is a hydrogen atom or an alkyl group having 1 to 10 carbon atoms; and a', b', c', d' and e' are numbers that satisfy: $0.35 \leq a' \leq 0.55$, $0 \leq b' \leq 0.2$, $0 \leq c' \leq 0.2$, $0.45 \leq d' \leq 0.65$, $0 \leq e' \leq 0.05$, and $a'+b'+c'+d'=1$.

5. The curable granular silicone composition according to claim 1, wherein component (C) comprises at least (c2-1) an organohydrogenpolysiloxane resin represented by the following average unit formula:

$$(R^4_3SiO_{1/2})_f(R^5_2SiO_{2/2})_g(R^5SiO_{3/2})_h(SiO_{4/2})_i(R^2O_{1/2})_j$$

wherein, each $R^4$ is the same or different and is a hydrogen atom or a monovalent hydrocarbon group having 1 to 10 carbon atoms, having no aliphatic unsaturated carbon bond, provided that at least two $R^4$ in one molecule are hydrogen atoms; $R^5$ is a monovalent hydrocarbon group having 1 to 10 carbon atoms, having no aliphatic unsaturated bond; $R^2$ is a hydrogen atom or an alkyl group having 1 to 10 carbon atoms; f, g, h and i are numbers that satisfy: $0.1 \leq f \leq 0.80$, $0 \leq g \leq 0.5$, $0 \leq h \leq 0.8$, $0 \leq i \leq 0.6$, $0 \leq j \leq 0.05$, where $h+i>0.1$, and $f+g+h+i+j=1$), and a hydrosilylation reaction catalyst, and the content of the organohydrogenpolysiloxane resin (c2-1) is such that the molar ratio of silicon bonded hydrogen atoms in the organohydrogenpolysiloxane resin (c2-1) to the curing-reactive functional group containing the carbon-carbon double bond in component (A) and component (B) is in the range of 0.5 to 20.

6. The curable granular silicone composition according to claim 1, wherein component (D) is a functional filler comprising at least a white pigment.

7. The curable granular silicone composition according to claim 1, further comprising (E) hot-melt particles having a dropping point of 50° C. or more and a melt viscosity of 10 Pa s or less measured by a rotational viscometer at 150° C.

8. The curable granular silicone composition according to claim 7, wherein component (E) is hot-melt particles comprising a fatty acid metal salt.

9. The curable granular silicone composition according to claim 1, wherein the curable granular silicone composition is in the form of pellets or sheets.

10. A cured object formed by curing the curable granular silicone composition according to claim 1.

11. A member for a semiconductor device comprising the cured object according to claim 10.

12. A light reflecting material comprising the cured object according to claim 10.

13. An optical semiconductor device comprising the cured object according to claim 10.

14. A method for producing the curable granular silicone composition according to claim 1, the method comprising mixing each component constituting the curable granular silicone composition under a temperature condition not exceeding 50° C. thereby granulating each component of the composition.

15. A method of molding a cured object, the method comprising:
 (I) heating and melting the curable granular silicone composition according to claim 1 to 50° C. or more to liquefy the composition;
 (II) injecting the liquid curable silicone composition obtained in step (I) into a mold and/or distributing the liquid curable silicone composition obtained in step (I) to a mold by clamping; and
 (III) curing the curable silicone composition injected and/or distributed in step (II).

* * * * *